United States Patent

Sasaki et al.

[11] Patent Number: 5,886,761
[45] Date of Patent: Mar. 23, 1999

[54] PROCESS FOR PRODUCING ACTIVELY ADDRESSING SUBSTRATE, AND LIQUID CRYSTAL DISPLAY

[75] Inventors: Tohru Sasaki, Mobara; Makoto Tsumura, Hitachi; Masaru Takabatake, Mobara; Masaaki Kitajima, Hitachiota, all of Japan

[73] Assignee: Hitachi, Ltd., Tokyo, Japan

[21] Appl. No.: 539,691

[22] Filed: Oct. 5, 1995

Related U.S. Application Data

[62] Division of Ser. No. 9,004, Jan. 26, 1993, Pat. No. 5,477,355.

[30] Foreign Application Priority Data

Jan. 28, 1992 [JP] Japan ...................... 4-013364

[51] Int. Cl.$^6$ ............ G02F 1/136; G02F 1/1333
[52] U.S. Cl. ............... 349/122; 349/43; 349/110
[58] Field of Search ................... 359/58, 59, 67, 359/68, 74; 349/41, 149, 42, 152, 106, 122, 110, 123, 43; 345/92; 257/59, 72

[56] References Cited

U.S. PATENT DOCUMENTS 5,124,823  6/1992  Kawasaki et al. ............... 349/42
5,196,721  3/1993  Miyake et al. ................... 257/292
5,289,016  2/1994  Noguchi ............................ 349/43

FOREIGN PATENT DOCUMENTS 0387805  9/1990  European Pat. Off. ........... 359/62

Primary Examiner—William L. Sikes
Assistant Examiner—Tai V. Duong
Attorney, Agent, or Firm—Antonelli, Terry, Stout & Kraus, LLP

[57] ABSTRACT

A photoresist 10 is exposed to light from behind a substrate by using as photomask a wiring electrodes 2 and 4 and a switching element 8 which are individually composed of an opaque member, whereby a passivation layer 9 for the switching element 8 is patterned. By virtue of this method, a photomask becomes unnecessary and jogs of the passivation layer 9 can be formed outside the transparent pixel electrode 7. Therefore, an unsatisfactory orientation of a liquid crystal can be made invisible without enlarging the black matrix of a counter substrate. Furthermore, since a passivation layer can be removed in portions not requiring the passivation layer, image-sticking can be reduced and the quality of displayed picture can be greatly improved. The present invention makes it possible to reduce the number of photomasks used for production of an actively addressing substrate and improve the picture quality of a liquid crystal display.

10 Claims, 10 Drawing Sheets

_5,886,761_

PROCESS FOR PRODUCING ACTIVELY ADDRESSING SUBSTRATE, AND LIQUID CRYSTAL DISPLAY

This application is a Divisional application of application Ser. No. 08/009,004, filed Jan. 26, 1993, now U.S. Pat. No. 5,477,355.

BACKGROUND OF THE INVENTION

1. Field of the Invention

The present invention relates to a process for producing an actively addressing substrate, and a liquid crystal display using the actively addressing substrate.

2. Description of the Prior Art

A liquid crystal display using a conventional actively addressing substrate has been disclosed in Japanese Patent Application Kokai No. 2-171721, and has a pixel electrode substrate provided with a transparent pixel electrode composed of a large number of ITO films, and a counter substrate provided with a common electrode which is placed face to face with said pixel electrode substrate with a liquid crystal layer placed between the these two substrates.

In the above prior art, in the pixel electrode substrate, gate wiring electrodes formed on a transparent substrate, drain wiring electrodes, the whole of thin film transistors (TFT), and a part of the transparent pixel electrode are covered with a passivation layer made of, for example, silicon nitride (SiN), except for portions not requiring the covering, for example, a connecting terminal portion to an external terminal. On the transparent pixel electrode, said passivation layer is laminated only on the peripheral portion of the electrode and covers said peripheral portion. Furthermore, an alignment layer is laminated on the whole passivation layer and the whole of the portion on which said passivation layer has not been laminated. Thus, the whole transparent pixel electrode substrate is covered with the alignment layer.

In the above prior art, the pixel electrode substrate having such a structure is produced in the following manner. The gate wiring electrode, the drain wiring electrode, the TFT and the transparent pixel electrode are formed on the transparent substrate, and then the silicon nitride layer is formed, for example, by a CVD method. After the coating with the silicon nitride layer photoresist, a photomask is placed thereon and exposure (exposure through the mask) to light is carried out. Then, etching is carried out to remove the silicon nitride layer laminated in the portion of the transparent pixel electrode other than the peripheral portion and the portions not requiring the silicon nitride layer, such as a connecting terminal portion to an external terminal, whereby the passivation layer is formed. Subsequently, the alignment layer is formed on the whole surface on the side on which said passivation layer has been laminated.

In a conventional method, since a photomask is used for patterning, a passivation layer should be left also inside a transparent pixel electrode in view of a margin of error in photomask alignment. Therefore, jogs corresponding to the thickness of the passivation layer are formed inside the transparent pixel electrode. The jogs are disadvantageous as follows. Rubbing treatment of an alignment layer for orienting a liquid crystal uniformly cannot be sufficiently carried out in portions corresponding to the aforesaid jogs, or the pre-tilt angle of liquid crystal molecules does not have a predetermined value in the vicinity of the portions corresponding to the aforesaid jogs. For these reasons and the like, unsatisfactory orientation of the liquid crystal takes place, so that the quality of displayed picture is markedly deteriorated. When the area of a black matrix to be formed on a counter substrate is increased for making the unsatisfactory orientation of said liquid crystal invisible, the aperture ratio is decreased, resulting in the following problems. The picture plane becomes dark, and the amount of electric power consumed is increased for increasing the brightness of a backlight.

Even when a passivation layer is not removed on a transparent pixel electrode, there is a problem that the passivation layer should be removed on the connecting terminal portion to an external circuit in order to improve the electric contact with the external circuit, so that neither the number of masks nor the number of steps can be reduced. In this case, the passivation layer is present on the transparent pixel electrode which applies a voltage to a liquid crystal layer, and hence when a liquid crystal display is operated, the direct-current voltage component of the applied voltage remains in the passivation layer, resulting in phenomena which deteriorate the quality of displayed picture, for example, image-sticking and flicker.

Therefore, Possin et al. carried out exposure to light from behind a substrate in order to remove the disadvantages of error in photomask alignment at the time of exposure, and remove a passivation layer on a gate electrode by etching by a reduced number of steps (U.S. Pat. No. 5,010,027). By this back exposure, a photomask need not be used, so that the problem of error in photomask alignment can be solved, namely, a margin need not be left. When a passivation layer is left as a margin on a gate electrode in a thin film transistor (TFT), a parasitic capacity is present, and hence the performance characteristics of the TFT are deteriorated. In other words, it is conjectured that Possin et al. carried out the back exposure in order to improve characteristics of TFT.

SUMMARY OF THE INVENTION

By contrast, the present invention is intended to remove an insulating layer on a transparent electrode used in a liquid crystal display. When the insulating layer is left as a margin, charging is caused on the electrode, so that a voltage applied to a liquid crystal varies, resulting in deterioration of the liquid crystal, and image-sticking on a display panel. In the present invention, for removing the insulating layer on the transparent electrode exactly, the back exposure described below is carried out. By virtue of this back exposure, a margin need not be left on the transparent electrode, so that a display portion can be kept bright.

The present invention is intended to reduce the number of photomasks used for producing an actively addressing substrate, solve the problem of deterioration of the quality of displayed picture which is caused in the above prior art, and provide a liquid crystal display capable of displaying a picture image of high quality and a process for producing said liquid crystal display.

The present invention provides, in a process for producing a substrate which comprises placing opaque members and transparent members on a transparent substrate, covering these opaque and transparent members with a passivation layer, applying a photoresist onto said passivation layer, selectively exposing said photoresist to light selectively, removing the light-exposed portion of the photoresist with a developer, removing the passivation layer in the portion in which the photoresist has been removed, then removing the non-exposed portion of the photoresist, and thus leaving the passivation layer only in the portion corresponding to said non-exposed portion, an improvement wherein the above-mentioned selective exposure is exposure of said photoresist to light transmitted by said transparent members from the transparent substrate side.

The present invention provides, in a process for producing an actively addressing substrate which comprises placing a switching element composed of an opaque member, a transparent pixel electrode composed of a transparent member which is to be connected to said switching element, and a gate wiring electrode and a drain wiring electrode which are individually composed of an opaque member, on a transparent substrate so as to form a matrix; covering said element and said electrodes with a passivation layer; applying a photoresist on said passivation layer; selectively exposing said photoresist to light; removing the light-exposed portion of the photoresist with a developer; removing the passivation layer in the portion in which the photoresist has been removed; then removing the non-exposed portion of the photoresist; and thus leaving the passivation layer only in the portion corresponding to said non-exposed portion, an improvement wherein the above-mentioned selective exposure is exposure of said photoresist to light transmitted by said transparent members from the transparent substrate side.

The present invention provides a process for producing an actively addressing substrate which comprises placing a switching element composed of an opaque member, a wiring electrode one side of which is to be connected to said switching element, and a transparent electrically conductive material one side of which is to be connected to said wiring electrode in the vicinity of said switching element by a laminated structure and the other side of which is to be connected to an external circuit, on a transparent substrate so as to form a matrix; covering said element, said electrode and said material with a passivation layer; applying a photoresist on said passivation layer; exposing said photoresist to light from the transparent substrate side; removing the light-exposed portion of the photoresist with a developer; removing the passivation layer in the portion in which said photoresist has been removed; then removing the non-exposed portion of the photoresist; and thus leaving the passivation layer only in the portion corresponding to said non-exposed portion.

The present invention provides a liquid crystal display comprising an actively addressing substrate produced by the above production process, an alignment layer formed thereon to a predetermined thickness, a transparent counter substrate placed in substantially parallel with and at a predetermined distance from said actively addressing substrate, a black matrix formed inside said counter substrate in portions corresponding to the members other than the transparent pixel electrode, a color filter formed inside said counter substrate in a portion corresponding to said transparent pixel electrode, a passivation layer formed on said black matrix and said color filter, a transparent common electrode and an alignment layer which are formed on said passivation layer, and a liquid crystal packed into the space between said actively addressing substrate and said counter substrate.

In the case of the above constitution, when a photoresist is patterned by exposing the photoresist to light transmitted by a transparent pixel electrode from behind a substrate by using as photomask a switching element and wiring electrodes which are individually composed of an opaque member, instead of exposing the photoresist to light from above the substrate through a photomask, and a passivation layer is etched, there is formed a structure in which the passivation layer remains only on wiring electrodes and a switching element, and jogs of the passivation layer are formed outside the transparent pixel electrode. In the transparent connecting terminal portion of the wiring electrode, the passivation layer having insulating properties is removed and the wiring electrode appears on the surface.

The connecting terminal portion of the wiring electrode is composed of the same transparent electirically conductive material as used in the transparent pixel electrode. The portion other than the connecting terminal portion is composed of an opaque wiring electrode material and used as a photomask, and the photoresist is exposed to light from behind the substrate. Thus, the number of photomasks for patterning the photoresist is reduced, or no photomask is used. Therefore, in the present invention,the passivation layer need not be left inside the transparent pixel electrode in view of a margin of error in photomask alignment. A jog corresponding to the thickness of the passivation layer due to the margin is not formed. Therefore, there can be solved the problem of the unsatisfactory orientation of a liquid crystal which is attributable to the facts that in a liquid crystal display, rubbing treatment for uniform orientation of the liquid crystal cannot be sufficiently carried out in a portion corresponding to a jog and that the pre-tilt angle of liquid crystal molecules does not have a predetermined value. Accordingly, the quality of displayed picture is greatly improved.

An actively addressing substrate of the present invention has a passivation layer (i.e. an insulating layer) having substantially the same pattern shape as that of an opaque member. In detail, in FIG. 1, the distance d between the boundary surface of an opaque member, for example, a drain wiring electrode 4 and the boundary surface of a passivation layer 9 shown by the broken line (the passivation layer 9 covers an area larger than that of the opaque member) is 1 $\mu$m or less. Hereinafter, the distance d is called "overlap margin". In a conventional actively addressing substrate, a margin should be left in anticipation of error in photomask alignment, and hence the value of the overlap margin d is unavoidably 3 to 5 $\mu$m which is one order of magnitude larger than the above value. As described above, only by the back exposure employed in the process of the present invention, a substrate having a very small overlap margin can be produced, and thereby the display portion of a liquid crystal display can be made brighter than before.

DESCRIPTION OF THE PREFERRED EMBODIMENTS

Examples of the present invention are explained below with reference to the drawings, but the present invention should not be construed to be restricted by these examples.

EXAMPLE 1

Figure 1:
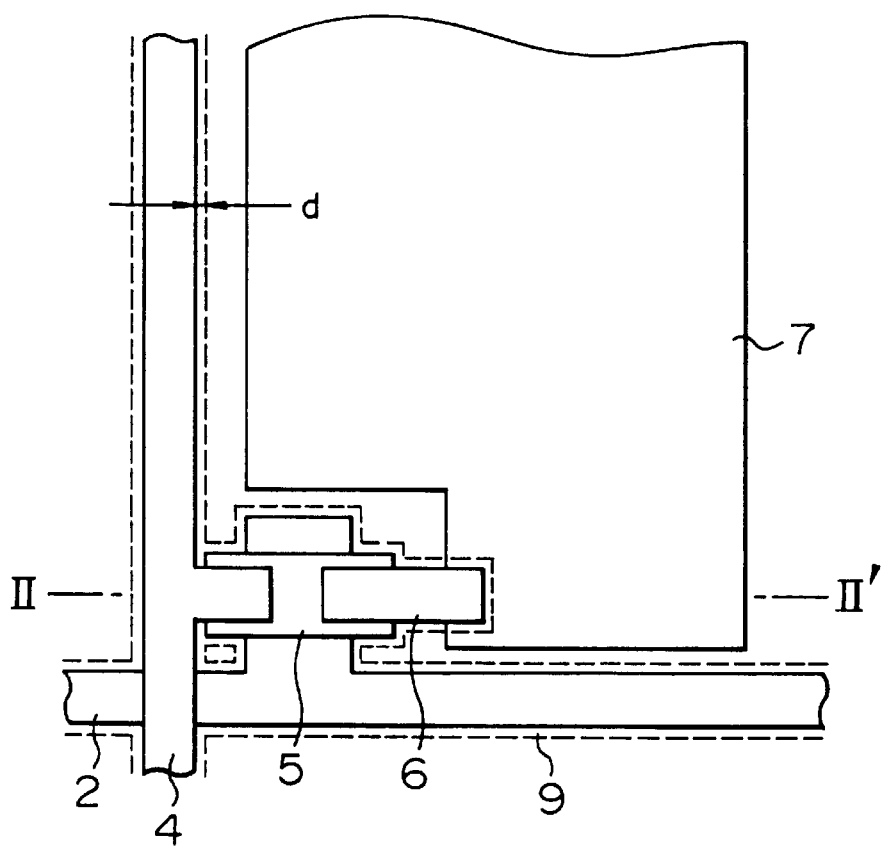
FIG. 1 is a plan view of an actively addressing substrate of an example of the present invention.

FIG. 1 is a plan view of an actively addressing substrate of the present example.

Figure 2:
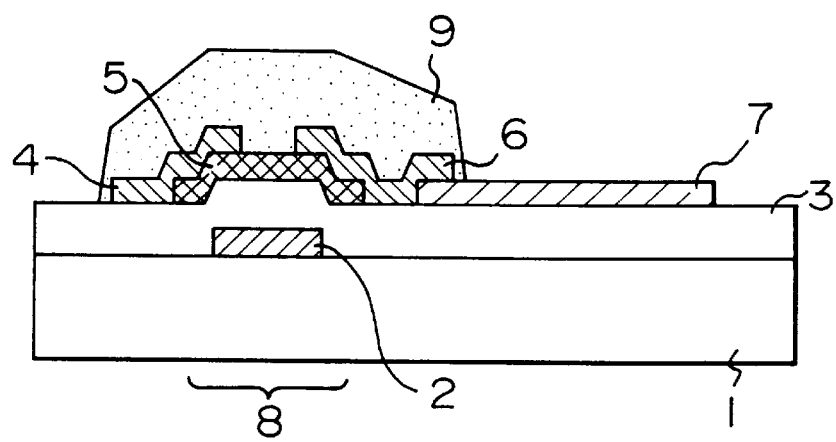
FIG. 2 is a vertical cross-sectional view taken along the line II—II' of FIG. 1.

FIG. 2 is a vertical cross-sectional view taken along the line II—II' of FIG. 1. In FIG. 2, numeral 1 shows an insulating transparent substrate made of glass, numeral 2 a gate wiring electrode made of a metal such as Cr or Al, numeral 3 a gate insulator composed of an electrical insulating layer of a metal oxide, silicon nitride or the like, numeral 4 a drain wiring electrode made of a metal such as Cr or Al, numeral 5 a channel layer made of a semiconductor such as amorphous silicon or polycrystalline silicon, numeral 6 a source electrode made of a metal such as Cr or Al, numeral 7 an electrically conductive transparent pixel electrode made of ITO, numeral 8 a TFT, and numeral 9 a passivation layer for the TFT which is composed of an electrical insulating layer of a metal oxide, silicon nitride or the like. As shown in FIG. 2, the actively addressing substrate has a structure in which passivation layer 9 has been removed in portions other than the wiring electrodes and the channel layer which are individually made of an opaque material, and a part of the transparent pixel electrode 7 has been exposed.

A method for removing a part of passivation layer 9 on the transparent pixel electrode 7 in a production procedure of the substrate having the structure shown in FIG. 2, is explained below with reference to FIG. 3 to FIG. 5.

First, passivation layer 9 is formed to a predetermined thickness by a CVD method or a sputtering method on the whole surface of the transparent substrate 1 on which the wiring electrodes 2 and 4, the TFT 8, the transparent pixel electrode 7, etc. have been formed. Then, a photoresist 10 is formed on the passivation layer 9 by a spin coating method or a roll coating method.

Figure 3:
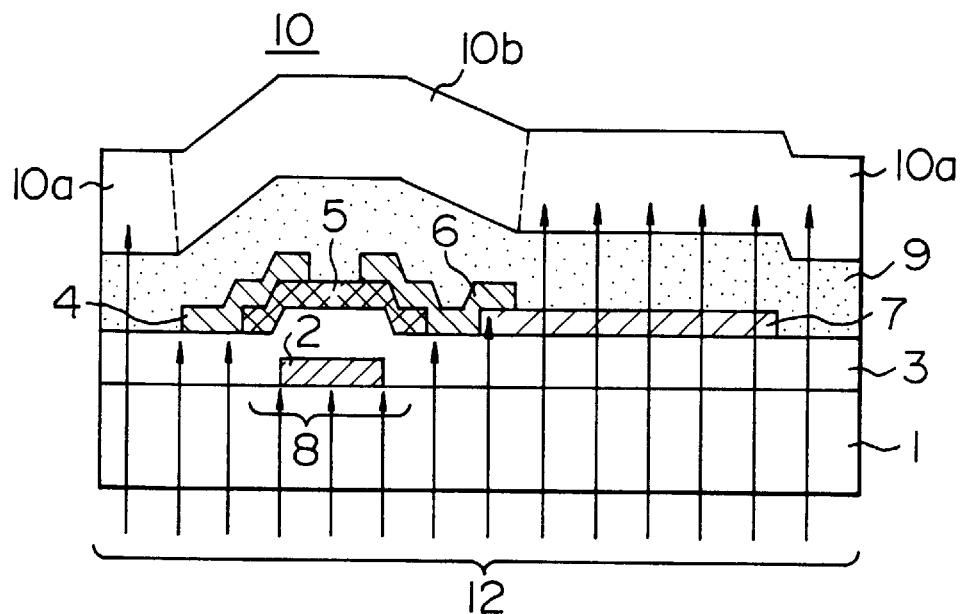
FIG. 3 is an illustration of a process for producing a substrate of Example 1 of the present invention.

As shown in FIG. 3, irradiation with light 12 from behind the transparent substrate 1 is carried out. The light 12 is not transmitted by the portions in which there are the gate wiring electrode 2, the drain wiring electrode 4, the channel layer 5 and the source electrode 6 which are individually made of an opaque material. But, in the other portions, the light 12 is transmitted by the transparent substrate 1, the gate insulator 3, the transparent pixel electrode 7 and the passivation layer 9 which are individually made of a transparent material, and the light 12 reaches photoresist 10a. In this case, a light exposure distribution can be given in the thickness direction of the photoresist 10a by reducing or increasing the exposure time, or increasing or reducing the intensity of the light 12. Therefore, the boundary between the light-exposed portion 10a and the non-exposed portion 10b of the photoresist can be formed with a slope to the inside of the transparent portion.

Figure 4:
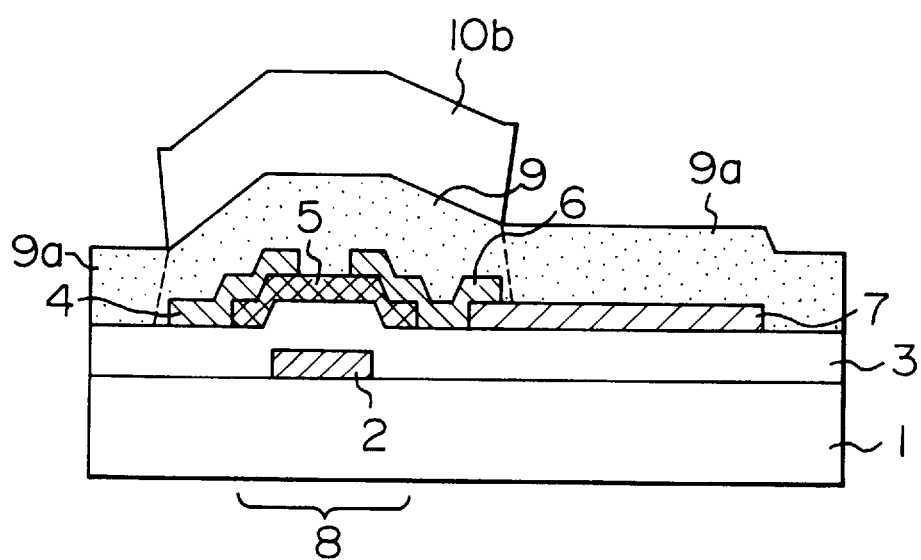
FIG. 4 is an illustration of a process for producing a substrate of Example 1 of the present invention.

As shown in FIGS. 3 and 4, the photoresist 10a, i.e., the light-exposed portion, is removed using a suitable developing solution.

Figure 5:
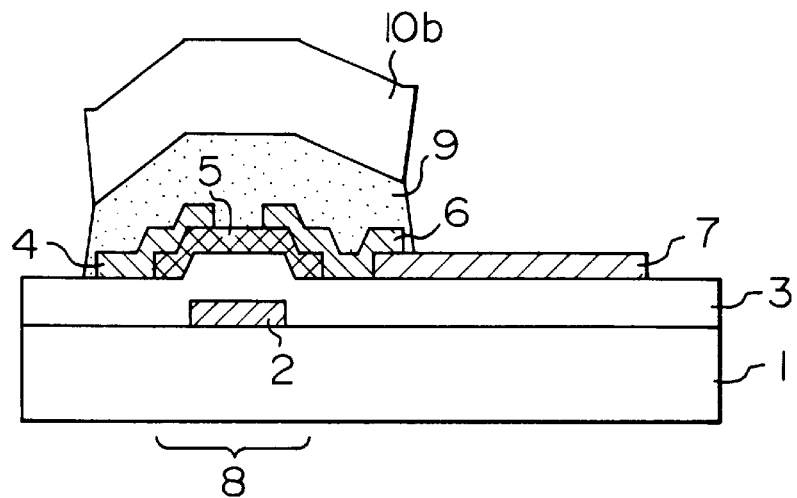
FIG. 5 is an illustration of a process for producing a substrate of Example 1 of the present invention.

As shown in FIGS. 4 and 5, passivation layer 9a, i.e., a portion of the passivation layer 9 which has appeared on the surface, is dry-etched or wet-etched. Particularly when anisotropic etching is conducted, the etching rate is seemingly decreased in portions of the passivation layer 9a which correspond to the overhanging portions of the photoresist 10b. Therefore, as shown in FIGS. 4 and 5, a certain slope (taper) can be given to the edge faces of the passivation layer 9, so that the drain wiring electrode 4, the channel layer 5 and the source electrode 6 which are individually made of an opaque material can be still covered with the passivation layer 9. This taper can improve the orientation of liquid crystal molecules. When the passivation layer 9 is composed of a member made of a material different from that for the gate insulator 3, the gate insulator is not over-etched in the portion under the passivation layer 9a already etched. Lastly, the photoresist 10b is removed using a suitable peeling solution to obtain the substrate having the structure shown in FIG. 2. Then, an alignment layer made of a polyimide resin is laminated on this substrate, and the substrate thus treated is used in a liquid crystal display.

Figure 6:
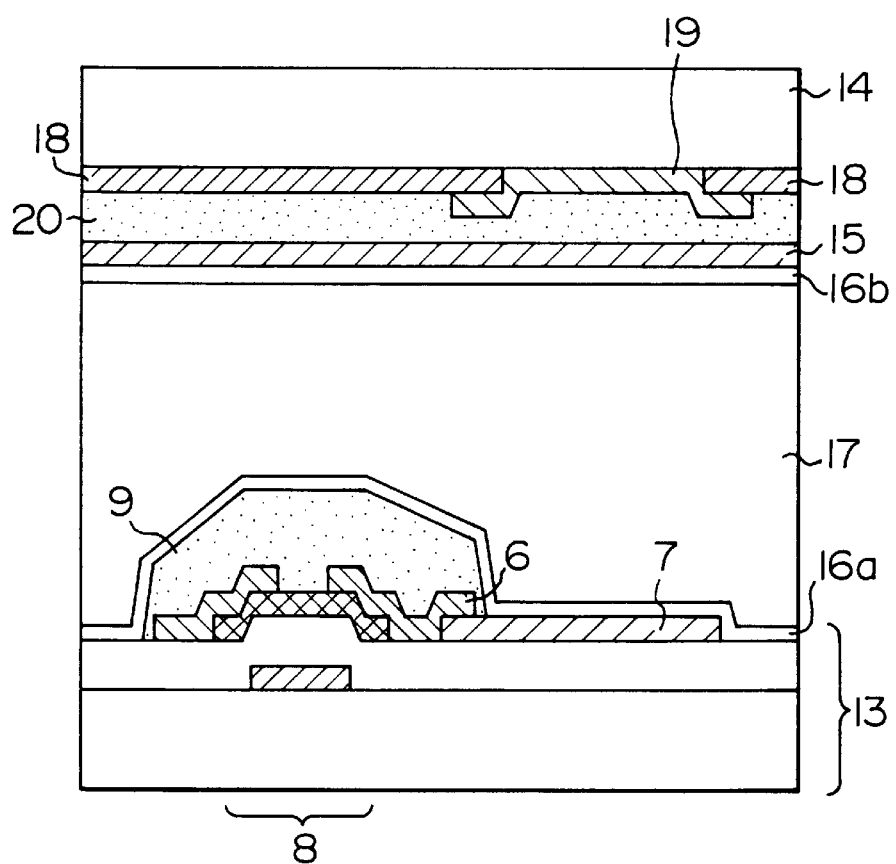
FIG. 6 is a cross-sectional view of a liquid crystal display composed by the use of the substrate shown in FIG. 2.

FIG. 6 is a cross-sectional view of the liquid crystal display composed by the use of the substrate shown in FIG. 2. In FIG. 6, numeral 13 shows the actively addressing substrate of TFT according to the present invention, numeral 14 a counter substrate placed face to face with the substrate 13 in parallel therewith at a distance of approximately 5–7 μm therefrom, numeral 15 a transparent common electrode formed out of ITO on the counter substrate, numeral 16a and 16b alignment layers made of a polyimide resin, numeral 17 a liquid crystal layer, numeral 18 a black matrix composed of a substantially black member, numeral 19 a color filter, and numeral 20a passivation layer for the color filter. Each of the alignment layers 16a and 16b has been subjected to rubbing treatment so as to orient the liquid crystal uniformly.

In the liquid crystal display having the structure shown in FIG. 6, the passivation layer 9 is not present at all at the end on the transparent pixel electrode 7 which applies a voltage to the liquid crystal layer 17. Therefore, the direct-current voltage component of the voltage applied to the liquid crystal layer 17 which is generated at the time of operation of the liquid crystal display does not remain in the passivation layer 9, so that there are suppressed phenomena which deteriorate the quality of displayed picture, such as image-sticking and flicker.

In FIG. 6, since the jogs of the passivation layer 9 have a certain slope, the alignment layer 16a can be sufficiently subjected to rubbing treatment even in portions corresponding to the jogs, so that an unsatisfactory orientation of the liquid crystal hardly occurs.

The jogs of the passivation layer 9 are formed outside the transparent pixel electrode except at the joint between the source electrode 6 of TFT and the transparent pixel electrode 7. Therefore, even when an unsatisfactory orientation of the liquid crystal occurs in portions corresponding to the jogs, the unsatisfactory orientation is invisible without increase of the area of the black matrix 18 to be formed on the counter substrate 14, so that a lowering of the aperture ratio can be suppressed.

Since the TFT 8 is not exposed but covered with the passivation layer 9, there can be maintained reliability with respect to the variation or deterioration of characteristics of the TFT 8.

Furthermore, since the patterning is conducted by back exposure, the number of photomasks can be reduced by one.

EXAMPLE 2

Figure 10:
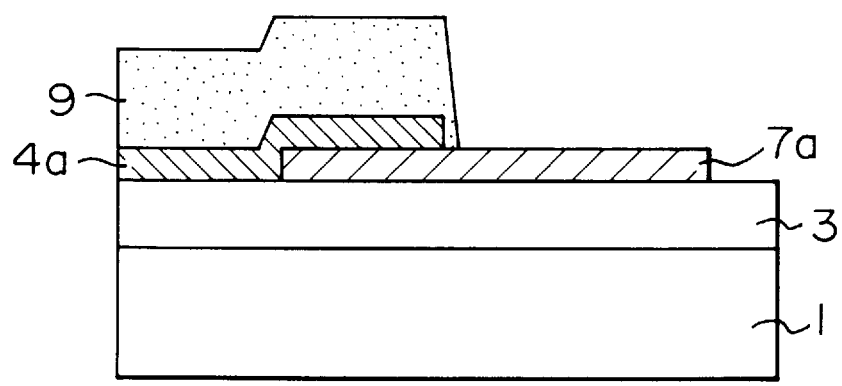
FIG. 10 is an illustration of a process for producing a substrate of Example 2 of the present invention.

FIG. 10 is a vertical cross-sectional view of the connecting terminal portion to external circuit of the drain wiring electrode of an actively addressing substrate of TFT which is one example of the present invention. In FIG. 10, numeral 1 shows an insulating transparent substrate made of glass, numeral 3 a gate insulator composed of an electrical insulating layer of a metal oxide, silicon nitride or the like, numeral 4a a drain wiring electrode made of a metal such as Cr or Al, numeral 7a an electrically conductive transparent electrode made of ITO, and numeral 9 a passivation layer composed of an electrical insulating layer of a metal oxide, silicon nitride or the like. The end of the drain wiring electrode 4a is formed on the transparent electrode 7a so as to cover a part of this electrode. In portions other than the drain wiring electrode 4a made of an opaque material, passivation layer 9 has been removed, resulting in a structure in which a part of the transparent electrode 7a has appeared on the surface.

A method for removing a part of passivation layer 9 on the transparent electrode 7a in the production of the substrate having the structure shown in FIG. 10 is explained below with reference to FIG. 7 to FIG. 10. First, passivation layer 9 is formed to a predetermined thickness by a CVD method or a sputtering method on the whole surface of the transparent substrate 1 on which the transparent electrode 7a and the drain wiring electrode 4a have been formed. Then, a photoresist 10 is formed on the passivation layer 9 by a spin coating method or a roll coating method.

Figure 7:
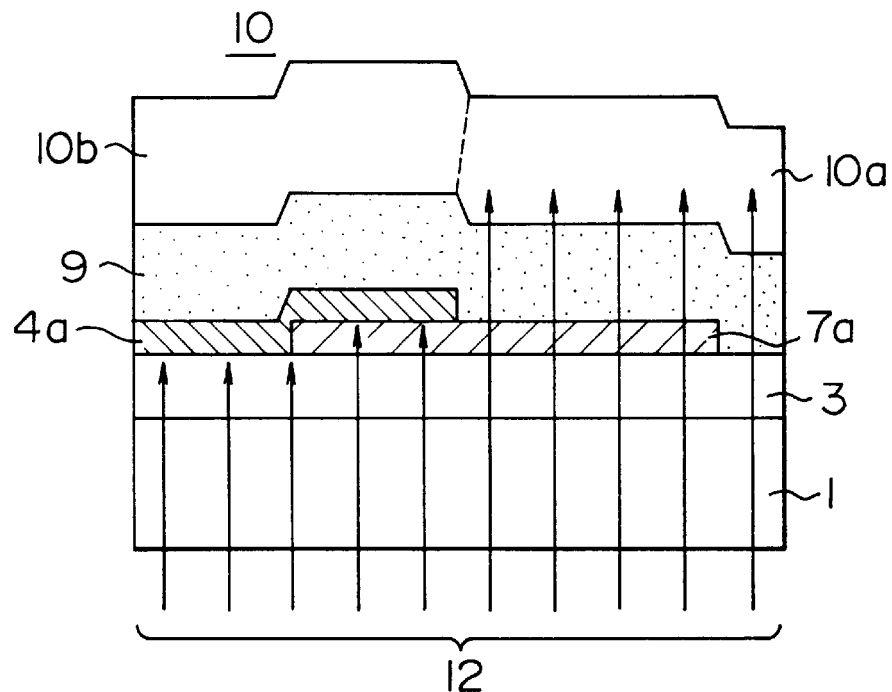
FIG. 7 is an illustration of a process for producing a substrate of Example 2 of the present invention.

As shown in FIG. 7, irradiation with light 12 from behind the transparent substrate 1 is carried out. The light 12 is not transmitted by the portion in which there is the drain wiring electrode 4a made of an opaque material. But, in the other portions, the light 12 is transmitted by the transparent substrate 1, the gate insulator 3, the transparent electrode 7a and the passivation layer 9 which are individually made of a transparent material, and the light 12 reaches photoresist 10a. In this case, a light exposure distribution can be given in the thickness direction of the photoresist 10a by reducing or increasing the exposure time, or increasing or reducing the intensity of the light 12. Therefore, the boundary between the light-exposed portion 10a and the non-exposed portion 10b of the photoresist can be formed with a slope to the inside of the transparent portion.

Figure 8:
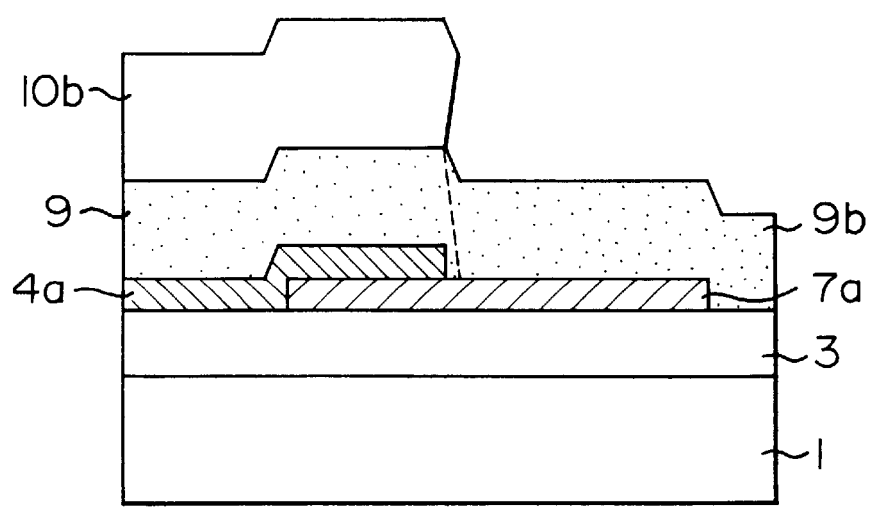
FIG. 8 is an illustration of a process for producing a substrate of Example 2 of the present invention.

As shown in FIG. 8, the photoresist 10a, i.e., the light-exposed portion is removed using a suitable developing solution.

Figure 9:
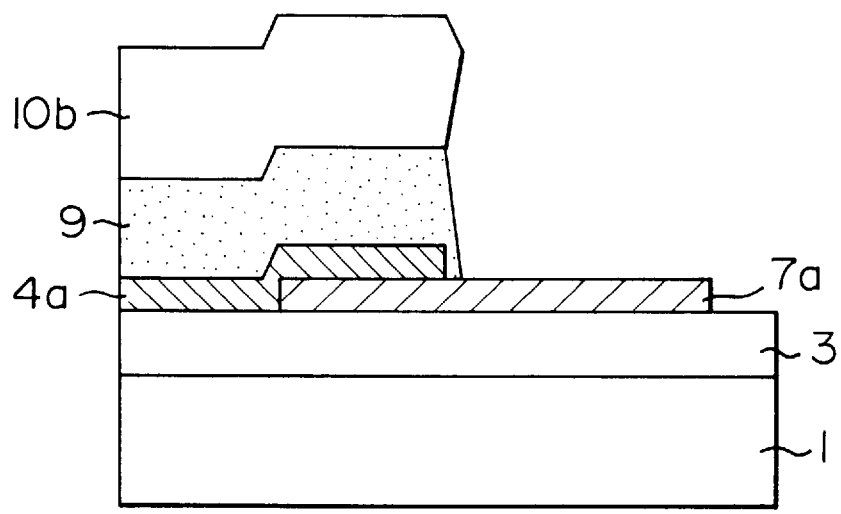
FIG. 9 is an illustration of a process for producing a substrate of Example 2 of the present invention.

As shown in FIG. 9, passivation layer 9b, i.e., a portion of the passiavation layer 9 which has appeared on the surface, is dry-etched or wet-etched. Particularly when anisotropic etching is conducted, the etching rate is seemingly decreased in a portion of the passivation layer 9b which corresponds to the overhanging portion of the photoresist 10b. Therefore, as shown in FIG. 9, a certain slope can be given to the edge face of the passivation layer 9, so that the drain wiring electrode 4a made of an opaque material can be still covered with the passivation layer 9. When the passivation layer 9 is composed of a member made of a material different from that for the gate insulator 3, the gate insulator is not over-etched in the portion under the passivation layer 9b already etched. Lastly, the photoresist 10b is removed using a suitable peeling solution to obtain the substrate having the structure shown in FIG. 10.

In the substrate shown in FIG. 10, the connecting terminal portion to external circuit of the transparent electrode 7a is not covered with the passivation layer 9. Therefore, electric contact with an external circuit can be satisfactorily made, so that said substrate makes it possible to operate a liquid crystal display by connecting the drain wiring electrode 4a to the external circuit through the transparent electrode 7a.

When the substrate of Example 1 is produced, the above procedure can be carried out simultaneously with the removal of the passivation layer on the transparent pixel electrode.

The reliability of the drain wiring electrode 4a can be maintained by employing a structure in which the drain wiring electrode 4a is covered with the passivation layer 9 so as not to be exposed, inside the display portion of the actively addressing substrate.

Moreover, since the patterning is conducted by back exposure, the number of photomasks can be reduced by one.

EXAMPLE 3

Figure 14:
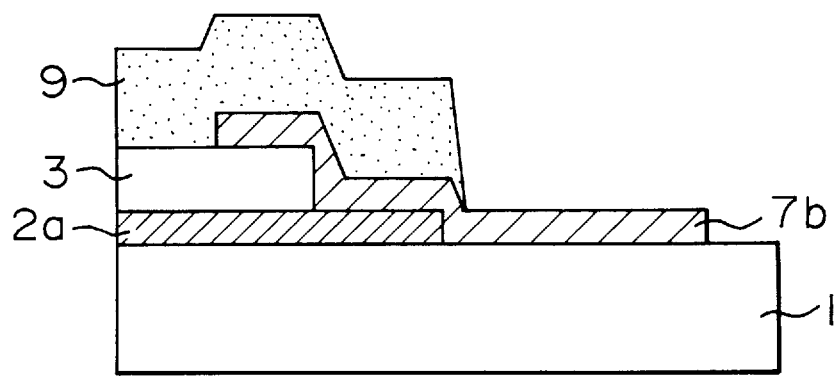
FIG. 14 is an illustration of a process for producing a substrate of Example 3 of the present invention.

FIG. 14 is a vertical cross-sectional view of the connecting terminal portion to external circuit of the gate wiring electrode of an actively addressing substrate of TFT which is one example of the present invention. In FIG. 14, numeral 1 shows an insulating transparent substrate made of glass, numeral 2a a gate wiring electrode made of a metal such as Cr or Al, numeral 3 a gate insulator composed of an electrical insulating layer of a metal oxide, silicon nitride or the like, numeral 7b an electrically conductive transparent electrode made of ITO, and numeral 9 a passivation layer composed of an electrical insulating layer of a metal oxide, silicon nitride or the like. In portions other than the wiring electrode made of an opaque material, passivation layer 9 has been removed, resulting in a structure in which a part of the transparent electrode 7b has appeared on the surface.

A method for removing a part of passivation layer 9 on the transparent electrode 7b in the production of the substrate having the structure shown in FIG. 14 is explained below with reference to FIG. 11 to FIG. 14. First, passivation layer 9 is formed to a predetermined thickness by a CVD method or a sputtering method on the whole surface of the transparent substrate 1 on which the gate wiring electrode 2a, the gate insulator 3 and the transparent electrode 7b have been formed. Then, a photoresist 10 is formed on the passivation layer 9 by a spin coating method or a roll coating method.

Figure 11:
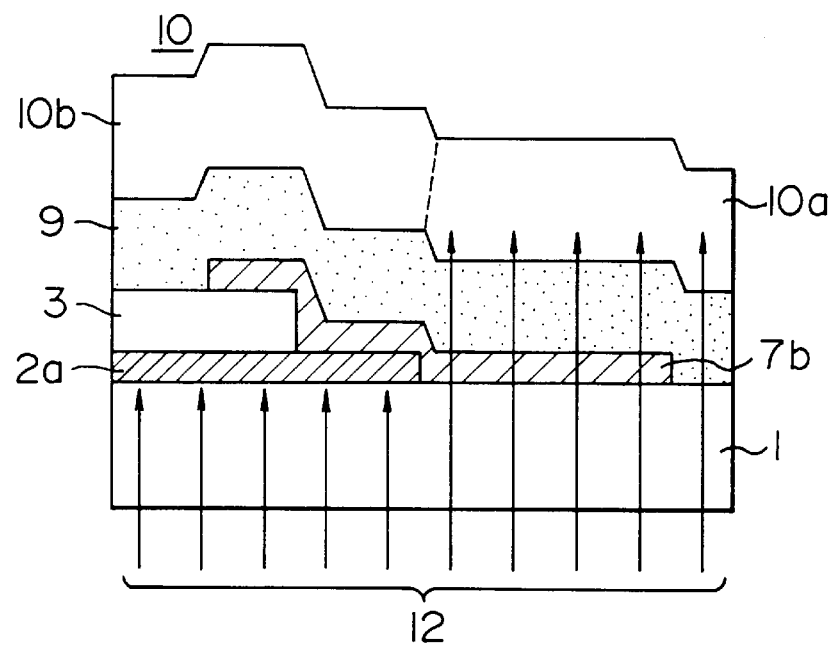
FIG. 11 is an illustration of a process for producing a substrate of Example 3 of the present invention.

As shown in FIG. 11, irradiation with light 12 from behind the transparent substrate 1 is carried out. The light 12 is not transmitted by the portion in which there is the gate wiring electrode 2a made of an opaque material. But, in the other portions, the light 12 is transmitted by the transparent substrate 1, the transparent electrode 7b and the passivation layer 9 which are individually made of a transparent material, and the light 12 reaches photoresist 10a. In this case, a light exposure distribution can be given in the thickness direction of the photoresist 10a by reducing or increasing the exposure time, or increasing or reducing the intensity of the light 12. Therefore, the boundary between the light-exposed portion 10a and the non-exposed portion 10b of the photoresist can be formed with a slope to the inside of the transparent portion.

Figure 12:
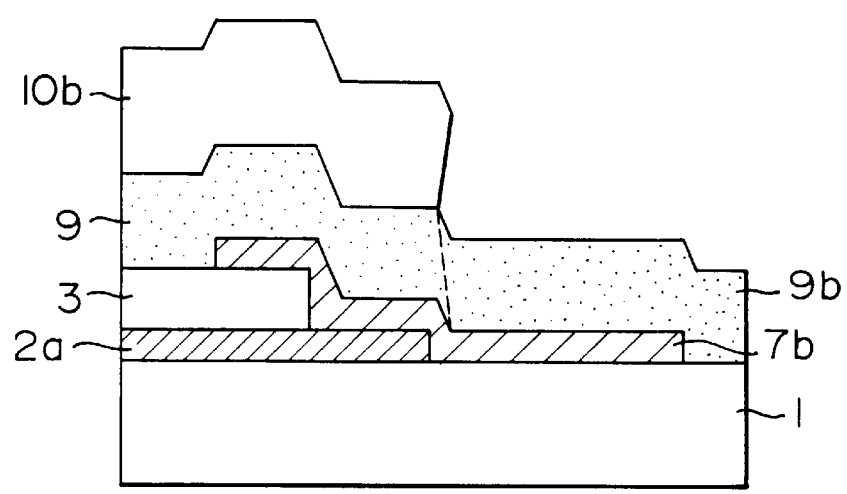
FIG. 12 is an illustration of a process for producing a substrate of Example 3 of the present invention.

As shown in FIG. 12, the photoresist 10a, i.e., the light-exposed portion is removed using a suitable developing solution.

Figure 13:
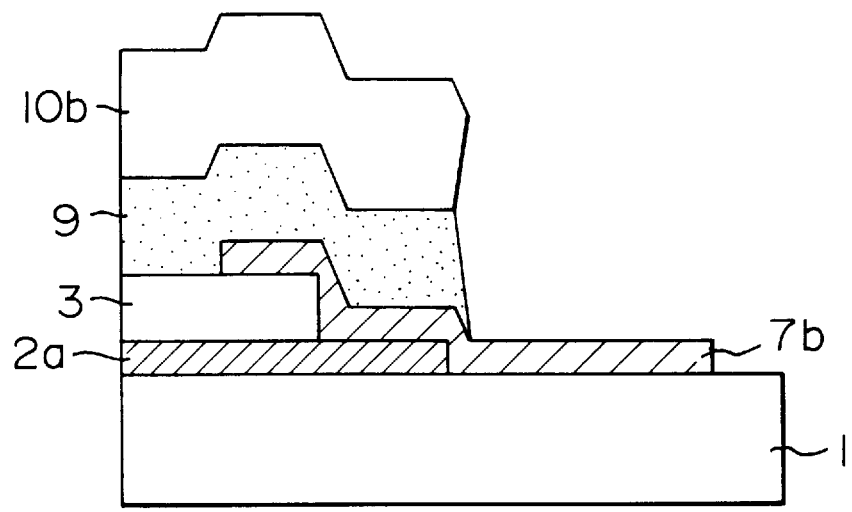
FIG. 13 is an illustration of a process for producing a substrate of Example 3 of the present invention.

As shown in FIG. 13, passivation layer 9b, i.e., a portion of the passivation layer 9 which has appeared on the surface, is dry-etched or wet-etched. Particularly when anisotropic etching is conducted, the etching rate is seemingly decreased in a portion of the passivation layer 9b which corresponds to the overhanging portion of the photoresist 10b. Therefore, as shown in FIG. 13, a certain slope can be given to the edge face of the passivation layer 9, so that the gate wiring electrode 2a made of an opaque material can be still covered with the passivation layer 9. When the passivation layer 9 is composed of a member made of a material different from that for the gate insulator 3, the gate insulator is not over-etched in the portion under the passivation layer 9b already etched. Lastly, the photoresist 10b is removed using a suitable peeling solution to obtain the substrate having the structure shown in FIG. 14.

In the substrate shown in FIG. 14, the connecting terminal portion to external circuit of the transparent electrode 7b is not covered with the passivation layer 9. Therefore, electric contact with an external circuit can be satisfactorily made, so that the substrate makes it possible to operate a liquid crystal display by connecting the gate wiring electrode 2a to the external circuit through the transparent electrode 7b.

When the substrate of Example 1 is produced, the above procedure can be carried out simultaneously with the removal of the passivation layer on the transparent pixel electrode.

The reliability of the gate wiring electrode 2a can be maintained by employing a structure in which the gate wiring electrode 2a is covered with the passivation layer 9 and the gate insulator 3 so as not to be exposed, inside the display portion of the actively addressing substrate.

In addition, since the patterning is conducted by back exposure, the number of photomasks can be reduced by one.

EXAMPLE 4

Figure 18:
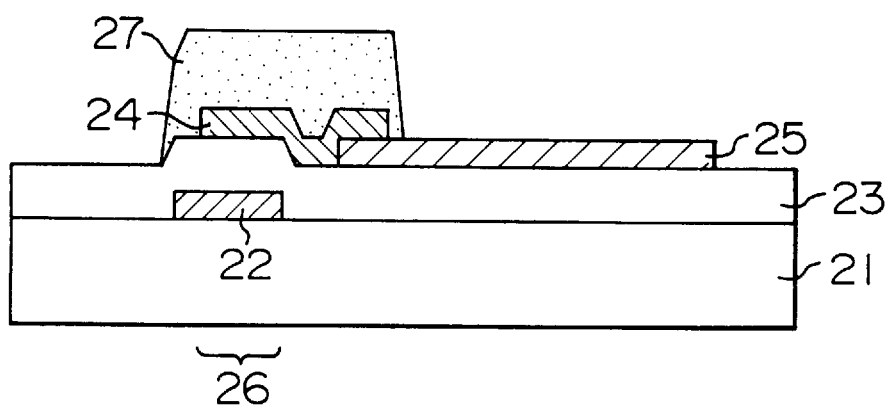
FIG. 18 is a vertical cross-sectional view of an actively addressing substrate of MIM which is one example of the present invention.

FIG. 18 is a cross-sectional view of an actively addressing substrate of MIM which is one example of the present invention. In FIG. 8, numeral 21 shows an insulating transparent substrate made of glass, numeral 22 a wiring electrode made of a metal such as Cr or Al, numeral 23 an insulating layer composed of an electrical insulating layer of a metal oxide, silicon nitride or the like, numeral 24 a contact electrode made of a metal such as Cr or Al, numeral 25 an electrically conductive transparent pixel electrode made of ITO, numeral 26 a thin film diode (MIM), and numeral 27 a passivation layer for the MIM which is composed of an electrical insulating layer of a metal oxide, silicon nitride or the like. In the portions other than the wiring electrode and the contact electrode which are individually made of an opaque material, passivation layer 27 has been removed, resulting in a structure in which a part of the transparent electrode 25 has appeared on the surface.

A method for removing a part of passivation layer 27 on the transparent pixel electrode 25 in the production of the substrate having the structure shown in FIG. 18 is explained below with reference to FIG. 15 to FIG. 18. First, passivation layer 27 is formed to a predetermined thickness by a CVD method or a sputtering method on the whole surface of the transparent substrate 21 on which the wiring electrode 22, the MIM 26, the transparent pixel electrode 25, etc. have been formed. Then, a photoresist 28 is formed on the passivation layer 27 by a spin coating method or a roll coating method.

Figure 15:
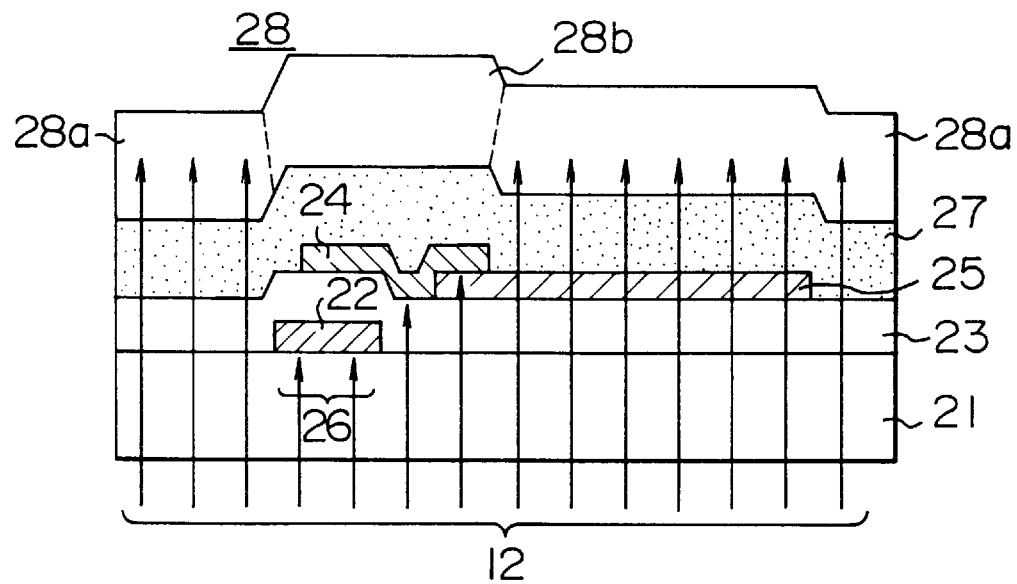
FIG. 15 is an illustration of a process for producing a substrate of Example 4 of the present invention.

As shown in FIG. 15, irradiation with light 12 from behind the transparent substrate 21 is carried out. The light 12 is not transmitted by the portions in which there are the wiring electrode 22 and the contact electrode 24 which are individually made of an opaque material. But, in the other portions, the light 12 is transmitted by the transparent substrate 21, the insulating layer 23, the transparent pixel electrode 25 and the passivation layer 27 which are individually made of a transparent material, and the light 12 reaches photoresist 28a. In this case, a light exposure distribution can be given in the thickness direction of the photoresist 28a by reducing or increasing the exposure time, or increasing or reducing the intensity of the light 12. Therefore, the boundary between the light-exposed portion 28a and the non-exposed portion 28b of the photoresist can be formed with a slope to the inside of the transparent portion.

Figure 16:
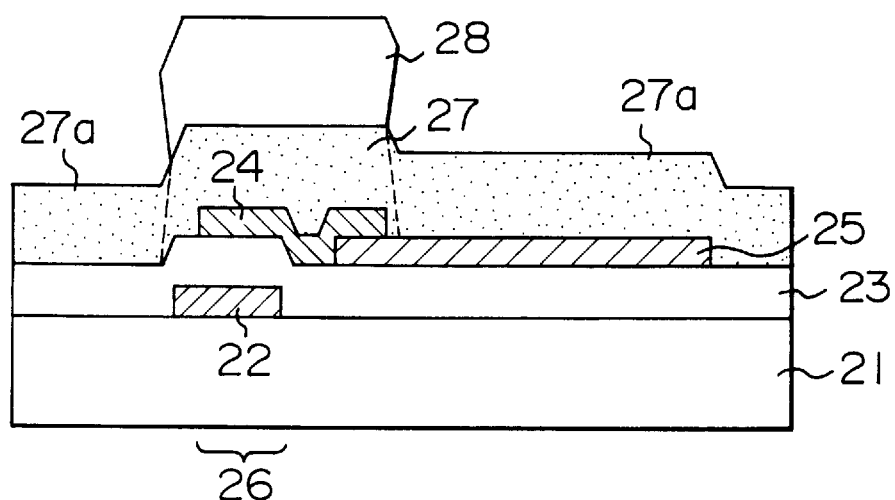
FIG. 16 is an illustration of a process for producing a substrate of Example 4 of the present invention.

As shown in FIG. 16, the photoresist 28a, i.e., the light-exposed portion is removed using a suitable developing solution.

Figure 17:
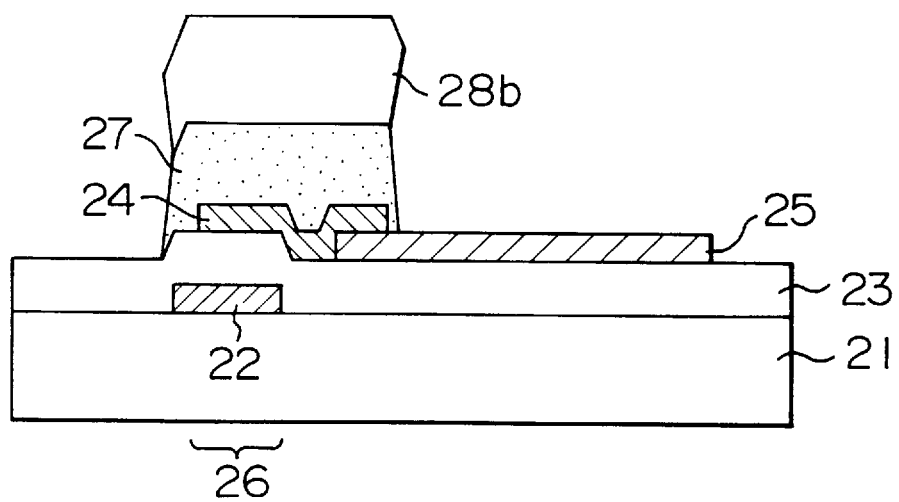
FIG. 17 is an illustration of a process for producing a substrate of Example 4 of the present invention.

As shown in FIG. 17, passivation layer 27a, i.e.,a portion of the passivation layer 27 which has appeared on the surface, is dry-etched or wet-etched. Particularly when anisotropic etching is conducted, the etching rate is seemingly decreased in a portion of the passivation layer 27a which corresponds to the overhanging portion of the photoresist 28b. Therefore, as shown in FIG. 17, a certain slope can be given to the edge faces of the passivation layer 27, so that the wiring electrode 22 and the contact electrode 24 which are individually made of an opaque material can be still covered with the passivation layer 27. When the passivation layer 27 is composed of a member made of a material different from that for the insulating layer 23, the insulating layer is not over-etched in the portion under the passivation layer 27a already etched. Lastly, the photoresist 28b is removed using a suitable peeling solution to obtain the substrate having the structure shown in FIG. 18. Then, an alignment layer made of a polyimide resin is laminated on this substrate, and the substrate thus treated is used in a liquid crystal display.

Figure 19:
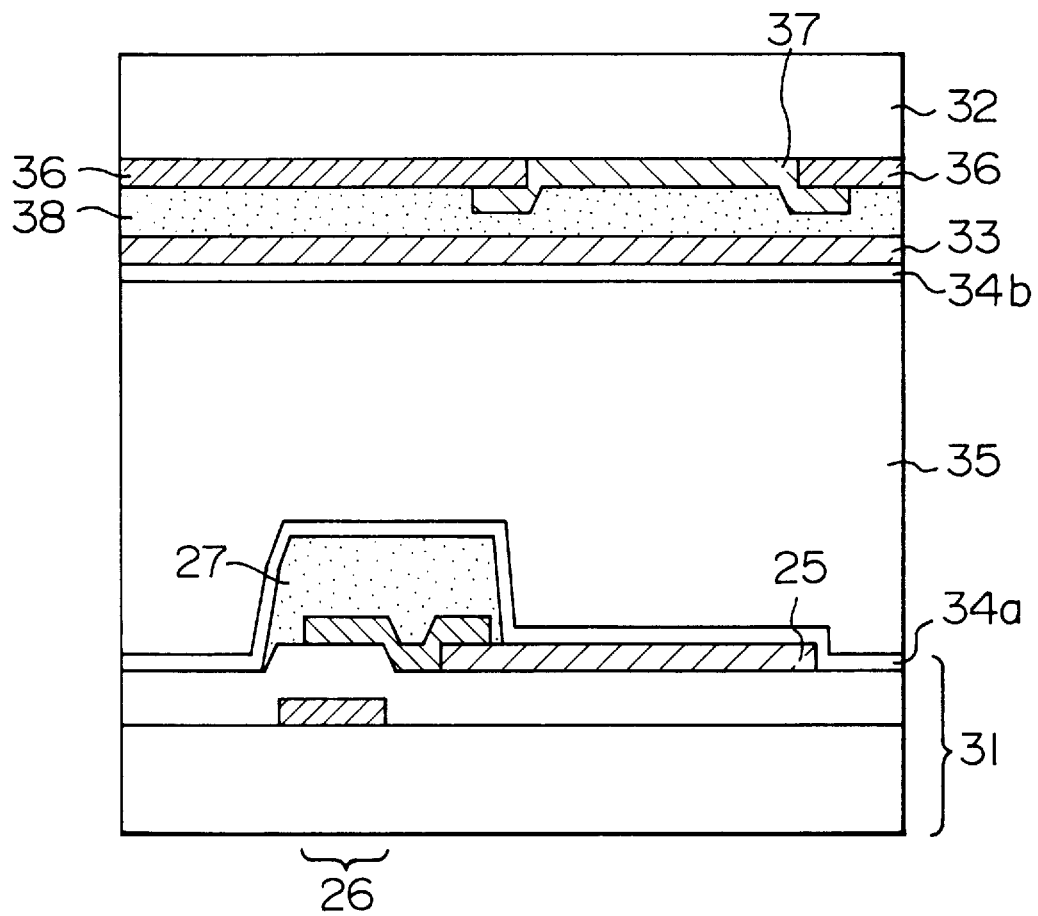
FIG. 19 is a vertical cross-sectional view of a liquid crystal display composed by the use of the substrate shown in FIG. 18.

FIG. 19 is a vertical cross-sectional view of a crystal liquid display composed by the use of the substrate shown in FIG. 18. In FIG. 19, numeral 31 shows the actively addressing substrate of MIM according to the present invention, numeral 32 a counter substrate placed face to face with the substrate 31 in parallel therewith at a distance of approximately 5–7 $\mu$m therefrom, numeral 33 a transparent common electrode formed out of ITO in stripes on the counter substrate, numeral 34a and 34b alignment layers made of a polyimide resin, numeral 35a liquid crystal layer, numeral 36 a black matrix composed of a substantially black member, numeral 37 a color filter, and numeral 38 a passivation layer for the color filter. Each of the alignment layers 34a and 34b has been subjected to rubbing treatment so as to orient the liquid crystal uniformly.

In the liquid crystal display having the structure shown in FIG. 19, the passivation layer 27 is not present on the transparent pixel electrode 25 which applies a voltage to the liquid crystal layer 35. Therefore, the direct-current voltage component of the voltage applied to the liquid crystal layer which is generated at the time of operation of the liquid crystal display does not remain in the passivation layer 27, so that there are suppressed phenomena which deteriorate the quality of displayed picture, such as image-sticking and flicker.

In FIG. 19, since the jogs of the passivation layer 27 have a certain slope, the alignment layer 34a can be sufficiently subjected to rubbing treatment even in portions corresponding to the jogs, so that an unsatisfactory orientation of the liquid crystal hardly occurs. In addition, the jogs of the passivation layer 27 are formed outside the transparent pixel electrode 25. Therefore, even when an unsatisfactory orientation occurs in portions corresponding to the jogs, the unsatisfactory orientation is invisible without increase of the width of the black matrix 36 to be formed on the counter substrate 32, so that a lowering of the aperture ratio can be suppressed.

The connecting terminal portion to external circuit of the wiring electrode 22 of the substrate shown in FIG. 18 can be formed simultaneously with the procedure of removing the passivation layer 27 on the transparent pixel electrode, by employing the structure described in Example 3.

Since the MIM 26 is not exposed but covered with the passivation layer 27, there can be maintained reliability with respect to, for example, the variation or deterioration of characteristics of the MIM 26.

Furthermore, since the patterning is conducted by back exposure, the number of photomasks can be reduced by one.

As explained above, when the production process according to the present example is employed, the number of photomasks can be reduced by one because the patterning is conducted by back exposure.

When a liquid crystal display is composed by the use of the actively addressing substrate according to the present example, the passivation layer for the switching element is not present on the transparent pixel electrode which applies a voltage to the liquid crystal layer. Therefore, the direct-current voltage component of the voltage applied to the liquid crystal layer which is generated at the time of operation of the liquid crystal display does not remain in the passivation layer, so that there are suppressed phenomena which deteriorate the quality of displayed picture, such as image-sticking and flicker.

By giving a certain slope to the jogs of the passivation layer, the alignment layer on the actively addressing substrate can be sufficiently subjected to rubbing treatment even in portions corresponding to the jogs. Moreover, the jogs of the passivation layer are formed outside of the transparent pixel electrode. Therefore, even when an unsatisfactory orientation of the liquid crystal occurs in the portions corresponding to the jogs, the unsatisfactory orientation is invisible without increase of the width of the black matrix to be formed on the counter substrate, so that a lowering of the aperture ratio can be suppressed.

Furthermore, the connecting terminal portion to external circuit of the wiring electrode can be formed simultaneously with the procedure of removing the passivation layer on the transparent pixel electrode.

By virtue of the above effects, the quality of displayed picture of the liquid crystal display can be greatly improved.

According to the present invention, a passivation layer can be formed only on opaque members requiring the passivation layer, in the following manner. A photoresist over transparent members is patterned by exposing the photoresist to light transmitted by the transparent members from behind a substrate, instead of exposing the photoresist to light from above the substrate through the photomask. Then, a passivation layer is etched in the portions in which the photoresist has been removed, namely, the passivation layer is removed on the transparent members. Thus, a photomask for patterning the photoresist is omitted, that is, no photomask is used for the patterning. Therefore, a margin of error in photomask alignment need not be left inside the transparent members. Furthermore, since jogs of the passivation layer are formed outside the transparent members, the deterioration of the picture quality of a liquid crystal display due to the jogs is prevented, so that the quality of displayed picture is greatly improved.

What is claimed is:

1. An actively addressing substrate comprising pixel electrodes, an opaque member and a passivation layer, wherein the distance (d) between the boundary surface of said opaque member and the boundary surface of said passivation layer is 1 µm or less, and wherein said passivation layer does not overlap with the pixel electrodes except at connection portions of said pixel electrodes where said pixel electrodes are connected to switching elements corresponding to said pixel electrodes.

2. An actively addressing substrate according to claim 1, wherein said opaque member includes a source electrode, a gate wiring electrode and a drain wiring electrode.

3. A liquid crystal display comprising
an actively addressing substrate according to claim 1,
an alignment layer formed thereon to a predetermined thickness,
a transparent counter substrate placed in substantially parallel with and at a predetermined distance from said actively addressing substrate,
a black matrix formed inside said counter substrate in portions corresponding to the members other than the transparent pixel electrode,
a color filter formed inside said counter substrate in a portion corresponding to said transparent pixel electrode,
a passivation layer formed on said black matrix and said color filter,
a transparent common electrode and
an alignment layer which are formed on said passivation layer, and
a liquid crystal packed into the space between said actively addressing substrate and said counter substrate.

4. A liquid crystal display comprising
an actively addressing substrate according to claim 2,
an alignment layer formed thereon to a predetermined thickness,
a transparent counter substrate placed in substantially parallel with and at a predetermined distance from said actively addressing substrate,
a black matrix formed inside said counter substrate in portions corresponding to the members other than the transparent pixel electrode,
a color filter formed inside said counter substrate in a portion corresponding to said transparent pixel electrode,
a passivation layer formed on said black matrix and said color filter, a transparent common electrode and an alignment layer which is formed overlying said passivation layer formed on said black matrix and said color filter, and a liquid crystal packed into the space between said actively addressing substrate and said counter substrate.

5. A liquid crystal display comprising an actively addressing substrate produced by a process comprising steps of:

placing a switching element composed of an opaque member, a transparent pixel electrode composed of a transparent member which is to be connected to said switching element, and a gate wiring electrode and a drain wiring electrode which are individually composed of an opaque member, on a transparent substrate so as to form a matrix, covering said element and said electrodes with a passivation layer, applying a photoresist on said passivation layer, selectively exposing said photoresist to light, said selectively exposing being an exposure of said photoresist to light transmitted by said transparent member from a transparent substrate side of the matrix, removing the light-exposed portion of the photoresist with a developer, removing the passivation layer in the portion in which the photoresist has been removed, wherein the passivation layer is left only on the wiring electrodes and the switching element in a desired region so as not to expose the wiring electrodes and the switching element, and the passivation layer is completely removed in other portions on the substrate, removing the non-exposed portion of the photoresist, and leaving a remaining passivation layer only in the portion corresponding to said non-exposed portion, the remaining passivation layer not overlapping with said pixel electrode except at a connection portion of said pixel electrode where said pixel electrode is connected to said switching element corresponding to said pixel electrode;

an alignment layer formed thereon to a predetermined thickness, a transparent counter substrate placed in substantially parallel with and at a predetermined distance from said actively addressing substrate, a black matrix formed inside said counter substrate in portions corresponding to the members other than the transparent pixel electrode, a color filter formed inside said counter substrate in a portion corresponding to said transparent pixel electrode, a passivation layer formed on said black matrix and said color filter, a transparent common electrode and an alignment layer which are formed on said passivation layer, and a liquid crystal packed into the space between said actively addressing substrate and said counter substrate.

6. A liquid crystal display according to claim 5, wherein said passivation layer of the actively addressing substrate is an insulating layer.

7. A liquid crystal display according to claim 6, wherein said passivation layer of the actively addressing substrate is transparent.

8. A liquid crystal display comprising an actively addressing substrate produced by a process comprising steps of:

placing a switching element composed of an opaque member, a wiring electrode one side of which is to be connected to said switching element, and a transparent electrically conductive material one side of which is to be connected to said wiring electrode in the vicinity of said switching element by a laminated structure and the other side of which is to be connected to an external circuit, on a transparent substrate so as to form a matrix, covering said element, said electrode and said material with a passivation layer, applying a photoresist on said passivation layer, exposing said photoresist to light from the transparent substrate side, removing the light-exposed portion of the photoresist with a developer, removing the passivation layer in the portion in which the said photoresist has been removed, removing the non-exposed portion of the photoresist, and leaving a remaining passivation layer only in the portion corresponding to said non-exposed portion, the remaining passivation layer not overlapping with said transparent electrically conductive material except connection portions of said transparent electrically conductive material where said conductive material is connected to said wiring electrode corresponding to said conductive material;

an alignment layer formed thereon to a predetermined thickness, a transparent counter substrate placed in substantially parallel with and at a predetermined distance from said actively addressing substrate, a black matrix formed inside said counter substrate in portions corresponding to the members other than the transparent electrically conductive material, a color filter formed inside said counter substrate in a portion corresponding to said transparent electrically conductive material, a passivation layer formed overlying said black matrix and said color filter, a transparent common electrode and an alignment layer which is formed on said passivation layer, and a liquid crystal packed into the space between said actively addressing substrate and said counter substrate.

9. A liquid crystal display according to claim 8, wherein said passivation layer of the actively addressing substrate is an insulating layer.

10. A liquid crystal display according to claim 9, wherein said passivation layer of the actively addressing substrate is transparent.

* * * * *